United States Patent
Gil et al.

(10) Patent No.: US 10,930,882 B2
(45) Date of Patent: Feb. 23, 2021

(54) ORGANIC LIGHT EMITTING DISPLAY DEVICE HAVING A SEAL PATTERN CORRESPONDING TO A CONCAVE PART

(71) Applicant: LG Display Co., Ltd., Seoul (KR)

(72) Inventors: Sung-Soo Gil, Seoul (KR); Min-Ho Oh, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/224,924

(22) Filed: Dec. 19, 2018

(65) Prior Publication Data

US 2019/0189957 A1  Jun. 20, 2019

(30) Foreign Application Priority Data

Dec. 20, 2017  (KR) .................. 10-2017-0176287

(51) Int. Cl.
  *H01L 51/52* (2006.01)
  *H01L 27/32* (2006.01)
  *H01L 51/56* (2006.01)

(52) U.S. Cl.
  CPC ...... *H01L 51/5246* (2013.01); *H01L 27/3246* (2013.01); *H01L 51/56* (2013.01); *H01L 2227/323* (2013.01)

(58) Field of Classification Search
  CPC ............. H01L 51/5246; H01L 27/3246; H01L 27/3241–3297
  See application file for complete search history.

(56) References Cited

U.S. PATENT DOCUMENTS

| | | | | |
|---|---|---|---|---|
| 2002/0187575 | A1* | 12/2002 | Maruyama | H01L 51/524 438/33 |
| 2003/0178923 | A1* | 9/2003 | Omura | H05B 33/04 313/44 |
| 2007/0212525 | A1* | 9/2007 | Sung | H01L 51/5246 428/192 |
| 2007/0285007 | A1* | 12/2007 | Lee | H01L 27/3251 313/504 |
| 2010/0052503 | A1 | 3/2010 | Fukagawa | |
| 2012/0056523 | A1* | 3/2012 | Han | H01L 51/5246 313/243 |
| 2014/0252386 | A1* | 9/2014 | Ito | H01L 51/524 257/98 |
| 2015/0028307 | A1 | 1/2015 | Kim et al. | |
| 2017/0179425 | A1 | 6/2017 | Quan et al. | |

(Continued)

FOREIGN PATENT DOCUMENTS

CN  101661999 A  3/2010
CN  202145251 U  2/2012

(Continued)

*Primary Examiner* — Kevin Parendo

(74) *Attorney, Agent, or Firm* — Birch, Stewart, Kolasch & Birch, LLP

(57) ABSTRACT

An organic light emitting display device can include a substrate including a non-active area and an active area having a plurality of sub pixels; an encapsulation substrate facing the substrate; a concave part in the encapsulation substrate; a seal pattern disposed on the encapsulation substrate in a single continuous closed loop of seal pattern material, the single continuous closed loop of seal pattern material having a starting point and an ending point overlapping with each other and the concave part in the encapsulation substrate.

22 Claims, 6 Drawing Sheets

(56) References Cited

U.S. PATENT DOCUMENTS

2017/0194397 A1* 7/2017 Kim .................... H01L 27/3251
2018/0159070 A1* 6/2018 He ..................... H01L 51/5246

FOREIGN PATENT DOCUMENTS

| | | |
|---|---:|---|
| CN | 104347814 A | 2/2015 |
| CN | 104393187 A | 3/2015 |
| JP | 2009-59532 A | 3/2009 |
| JP | 2010-55918 A | 3/2010 |
| JP | 2011-128481 A | 6/2011 |
| KR | 10-2017-0064129 A | 6/2017 |
| KR | 10-2017-0071282 A | 6/2017 |

* cited by examiner

ORGANIC LIGHT EMITTING DISPLAY DEVICE HAVING A SEAL PATTERN CORRESPONDING TO A CONCAVE PART

CROSS-REFERENCE TO RELATED APPLICATION

This application claims the priority benefit of Korean Patent Application No. 10-2017-0176287, filed on Dec. 20, 2017, the entirety of which is hereby incorporated by reference as if fully set forth herein.

BACKGROUND OF THE INVENTION

Field of the Invention

The present invention relates to an organic light emitting display device, and more particularly, to an organic light emitting display device and a method of manufacturing the same, in which a shape of an encapsulation substrate is changed to prevent defects or problems regarding the amount of a seal pattern material coated between opposite substrates for adherence therebetween.

Discussion of the Related Art

Recently, with the advent of the information age, a display field for visually expressing electrical information signals has rapidly developed. To meet this trend, various flat display devices having excellent performance and characteristics, such as miniaturized, lightweight, and low power consumption flat display devices have been developed and have rapidly replaced an existing cathode ray tube (CRT) display devices.

Examples of flat display devices may include liquid crystal display devices (LCDs), plasma display panel devices (PDPs), field emission display devices (FEDs), organic light emitting display devices (OLEDs), etc.

There among, OLEDs, which do not require a separate light source, are designed in a compact size, and display vivid color, have been considered as a competitive option.

Such an OLED includes organic light emitting diodes for independently driving respective subpixels and, in this regard, the organic light emitting diode includes an organic layer including positive and negative electrodes and an organic light emitting layer therebetween.

For example, an OLED has an array configuration that includes a thin film transistor and an organic light emitting diode to correspond to each sub pixel on a lower substrate and includes an encapsulation substrate for sealing the organic light emitting diode vulnerable to moisture to face the array. In addition, the OLED includes a seal pattern (e.g., dam pattern) that surrounds an edge between the lower substrate and the encapsulation substrate to seal a space between the encapsulation substrate and the lower substrate, which are positioned at upper and lower parts, from outdoor air at lateral surfaces.

In general, a seal pattern is coated on an encapsulation substrate, and the encapsulation substrate and a lower substrate are adhered to face each other. In this instance, starting and ending points for coating the seal pattern should overlap each other to seal an internal space of the seal pattern without penetration of outdoor air and, thus, the starting and ending points of the seal pattern inevitably and partially overlap with each other. Accordingly, an excessive amount of a seal pattern material remains at the start and end points of the seal pattern, which overlap with each other, and, thus, a width of a portion of the seal pattern at the start and end points is increased compared with other regions after the encapsulation substrate and the lower substrate are adhered to each other and, when pressure is applied during an adherence procedure, the width is further increased. As such, when a general method of forming a seal pattern with the same width is used, a width of the seal pattern at a specific point is not capable of being controlled due to errors in terms of the amount of a seal pattern material because the start and end points overlap with each other and, accordingly, a width of a bezel region that hides a non-active area that is not used for display is increased and a narrow bezel is not possible.

In addition, when excessive pressure is applied via adherence between substrates at a portion at which an excessive amount of a seal pattern material is coated due to an overlap between portions of the seal pattern, there is a problem in that the seal pattern goes over an active area (e.g., the seal pattern can squish over into the active area and invade portions of the display which are supposed to display images and be viewable to a user). However, there is no existing solution to overcome this problem using a current OLED structure.

SUMMARY OF THE INVENTION

An object of the present invention is to provide an organic light emitting display device and a method of manufacturing the same, in which a shape of an encapsulation substrate is changed to prevent errors in terms of the amount of a seal pattern material coated between opposite substrates for adherence therebetween.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device and a method of manufacturing the same is provided, in which a shape of an encapsulation substrate is changed to correspond to start and end points for coating a seal pattern material and to accommodate an excessive amount of a seal pattern material, in order to provide a uniform width of a seal pattern for each region, thereby achieving a narrow bezel.

In an aspect of the present invention, an organic light emitting display device includes a substrate and an encapsulation substrate that face each other and each have an active area including a plurality of sub pixels and a non-active area surrounding the active area, a concave part included in the non-active area of the encapsulation substrate, a seal pattern disposed within the non-active area between the substrate and the encapsulation substrate and in a closed loop with a uniform height, and a filling seal pattern formed of the same material as the seal pattern and filled in the concave part to overlap with the seal pattern.

The seal pattern and the filling seal pattern can be integrated into each other and have the same width.

The concave part can correspond to an internal surface of the encapsulation substrate and the concave part can include a bottom surface with a first depth from the inner surface of the encapsulation substrate and a lateral surface inclined at an obtuse angle with respect to the bottom surface.

The first depth can be approximately 0.1 to 0.6 times a thickness of the active area of the encapsulation substrate.

The obtuse angle of the lateral surface with respect to the bottom surface in the concave part can be approximately 125° to 145°.

A vertical cross section of the filling seal pattern can be approximately 0.1 to 0.4 times a cross section of the seal pattern connected to the filling seal pattern.

The sub pixel can include at least one thin film transistor, an overcoat layer for covering the thin film transistor, and an organic light emitting diode configured by stacking parts on the substrate, and the organic light emitting diode can include a first electrode, an organic light emissive layer, and a second electrode, which is electrically connected to the thin film transistor on the overcoat layer.

The organic light emitting display device can further include a color filter layer disposed on the encapsulation substrate to correspond to each sub pixel.

The organic light emitting display device can further include a protective layer for covering the organic light emitting diode on the substrate, in which the protective layer can overlap with the seal pattern by a partial width.

The organic light emitting display device can further include a filling member in an internal region of the seal pattern between the substrate and the encapsulation substrate.

In another aspect of the present invention, a method of manufacturing an organic light emitting display device includes preparing a substrate including a first active area including a plurality of sub pixels and a first non-active area surrounding the first active area, preparing an encapsulation substrate including a second active area and a second non-active area, which correspond to the first active area and the first non-active area of the substrate, respectively, disposing a concave part within the second non-active area, coating a seal pattern material in a closed loop to have a start point and an end point corresponding to the concave part, and adhering the substrate and the encapsulation substrate to allow the seal pattern material to face the substrate.

In the adhering of the substrate and the encapsulation substrate, the seal pattern material can be used to form a filling seal pattern filled in the concave part and a seal pattern that overlaps with the filling seal pattern and has a uniform height within the non-active area.

In the coating of the seal pattern material, the seal pattern material can be coated twice to correspond to the start and end points.

The disposing of the concave part can include forming the concave part including a bottom surface with a first depth on the encapsulation substrate and a lateral surface inclined at an obtuse angle with respect to the bottom surface.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain principles of the invention. In the drawings.

DETAILED DESCRIPTION OF EMBODIMENTS OF THE INVENTION

Figure 1:
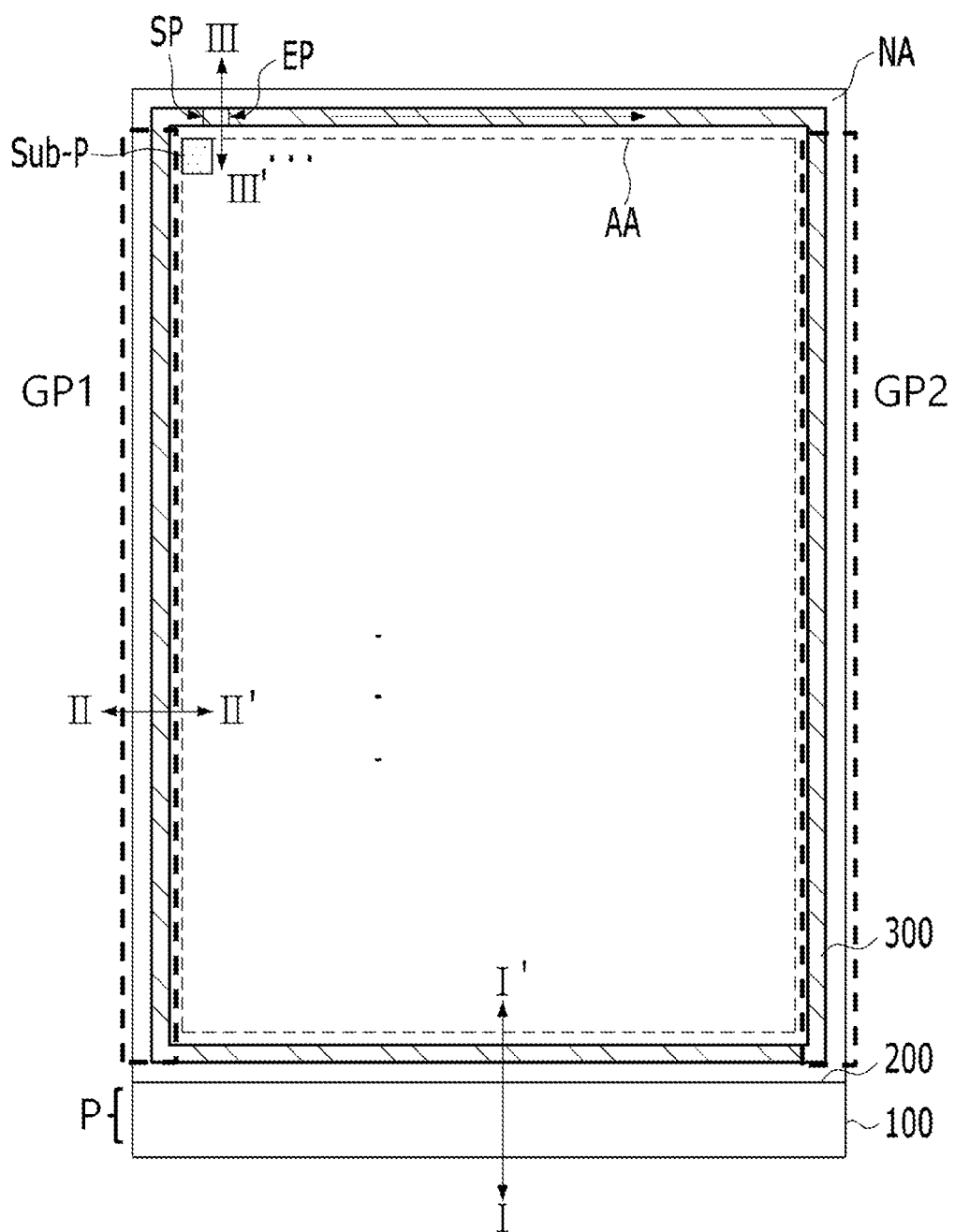
FIG. 1 is a plan view of an organic light emitting display device (OLED) according to an embodiment of the present invention.

Hereinafter, the present invention will be described more fully with reference to the accompanying drawings, in which example embodiments of the invention are shown. The invention can, however, be embodied in many different forms and should not be construed as being limited to the embodiments set forth herein; rather, these embodiments are provided so that this disclosure will be thorough and complete, and will fully convey the concept of the invention to those skilled in the art.

The shapes, sizes, ratios, angles, numbers and the like disclosed in the drawings to describe embodiments of the present invention are merely examples and the present invention is not limited thereto. Like reference numerals refer to like elements throughout the specification. In the following description of the present invention, a detailed description of known related art will be omitted when it is determined that the subject matter of the present invention may be unnecessarily obscured.

As used herein, the terms "comprise," "having," "including" and the like suggest that other parts can be added unless the term "only" is used. As used herein, the singular forms "a," "an," and "the" are intended to include the plural forms as well, unless context clearly indicates otherwise.

Elements are to be interpreted as including margins of error even without explicit statements.

In describing positional relationships, phrases such as "an element A on an element B," "an element A above an element B," "an element A below an element B" and "an element A next to an element B," another element C may be disposed between the elements A and B unless the term "immediately" or "directly" is explicitly used.

In describing temporal relationships, terms such as "after," "subsequent to," "next to," "before," and the like may include situations where any two events are not consecutive, unless the term "immediately" or "directly" is explicitly used.

In describing elements, terms such as "first" and "second" are used, but the elements are not limited by these terms. These terms are simply used to distinguish one element from another. Accordingly, as used herein, a first element may be a second element within the technical idea of the present invention.

It should be understood that the term "at least one" includes all possible combinations of one or more related items. For example, "at least one of a first item, a second item and a third item" means not only each of the first item, the second item or the third item but also all possible combinations of two or more of the first item, the second item and the third item.

Features of various embodiments of the present invention can be partially or fully combined. As will be clearly appreciated by those skilled in the art, various interactions and operations are technically possible. Various embodiments can be practiced individually or in combination.

The present invention will now be described more fully with reference to the accompanying drawings, in which example embodiments of the invention are shown.

Figure 2:
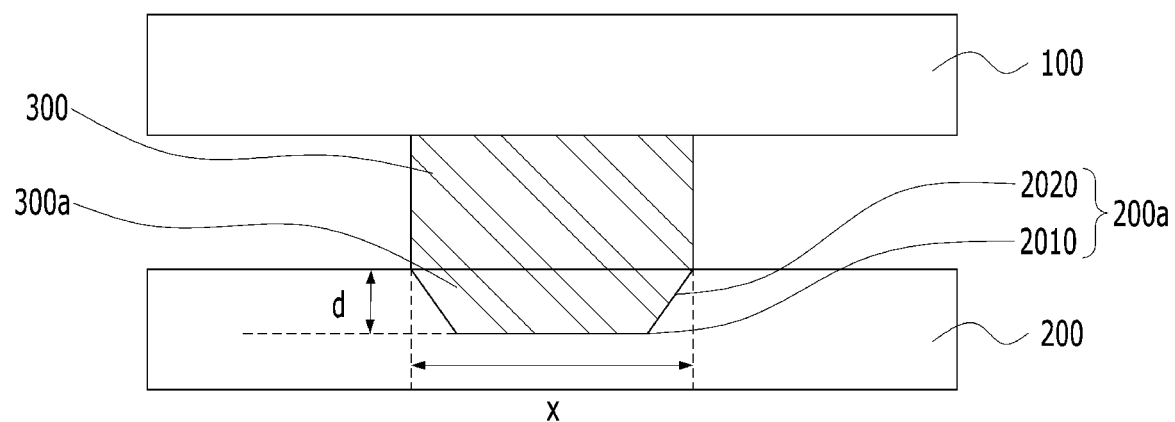
FIG. 2 is a cross-sectional view illustrating a concave part of an OLED and an adherence state corresponding thereto according to an embodiment of the present invention.

FIG. 1 is a plan view of an organic light emitting display device (OLED) according to an embodiment of the present invention. FIG. 2 is a cross-sectional view illustrating a concave part of an OLED and an adherence state corresponding thereto according to an embodiment of the present invention.

Referring to FIGS. 1 and 2, the OLED according to an embodiment of the present invention can include a substrate 100 and an encapsulation substrate 200 which face each other and the substrate, the encapsulation substrate and an area between the substrate and the encapsulation substrate have an active area AA and a non-active area NA surrounding the active area AA, in which the active area between the substrate and the encapsulation substrate includes a plurality of sub pixels Sub-P, a concave part 200a included in a portion of the non-active area NA of the encapsulation substrate 200; a seal pattern 300 that is disposed in the non-active area NA between the substrate 100 and the encapsulation substrate 200 and is formed in a closed loop with a uniform height; and a filling seal pattern 300a that is formed of the same material as the seal pattern 300 and is filled in the concave part 200a to overlap with the seal pattern 300.

Here, the seal pattern 300 and the filling seal pattern 300a can be integrated into each other and have the same width because they are disposed to overlap with each other on a portion on which a seal pattern material is coated during coating of the seal pattern material.

With regard to the filling seal pattern 300a, an excessive amount of a seal pattern material is accommodated in the concave part 200a during a procedure of coating a seal pattern material and adhering the substrate 100 and the encapsulation substrate 200 and, thus, the seal pattern 300 can have an overall uniform height at a portion where the concave part 200a is positioned and a portion where the concave part 200a is not positioned (e.g., a portion where a seal pattern material is normally coated without overlapping with another material). For example, an extra glob of seal pattern material can occur at the ends of a bead—especially when the ends of the bead are made to overlap on top of each other (e.g., when forming a loop), and the concave part 200a is specifically sized in order accommodate the extra glob of sealing material and allows a perfect bead of seal pattern material to be laid down and around the edges in a closed loop with uniform height and uniform width.

The concave part 200a can include a bottom surface 2010 disposed with a uniform height on the encapsulation substrate 200 and a lateral surface 2020 inclined at an obtuse angle with respect to the bottom surface 2010 of the concave part 200a, which corresponds to an inner surface of the encapsulation substrate 200. That is, the concave part 200a can be formed by removing a trapezoidal portion from the inner surface of the encapsulation substrate 200 as seen from FIG. 2 (e.g., a frustum shaped ditch can be carved into the inner surface of the encapsulation substrate 200).

A first depth "d" can be approximately 0.1 to 0.6 times a thickness "h" of the encapsulation substrate 200. That is, the concave part 200a can be formed by removing a corresponding portion using a predetermined etch method and can have a width "x" for accommodating material in the removed portion. The width "x" can correspond to an interval between a start point SP and an end point EP for coating a seal pattern material and correspond to a region in which a seal pattern material is coated twice (e.g., the ends of a bend of seal pattern material can be doubled over each other or overlapped with each other to form a continuous closed loop).

In the concave part 200a, an obtuse angle of the lateral surface 2020 with respect to the bottom surface 2010 can be approximately 125° to 145°.

Hereinafter, a method of coating a seal pattern of an OLED according to embodiments of the present invention is described in detail.

Figure 3:
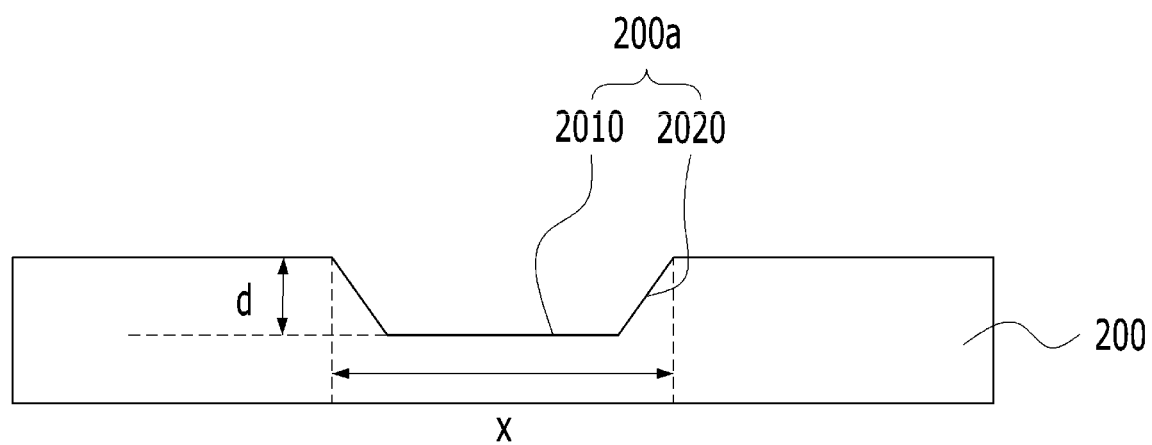
FIG. 3 is a cross-sectional view of an encapsulation substrate of the OLED of FIG. 2 according to an embodiment of the present invention.
Figure 4:
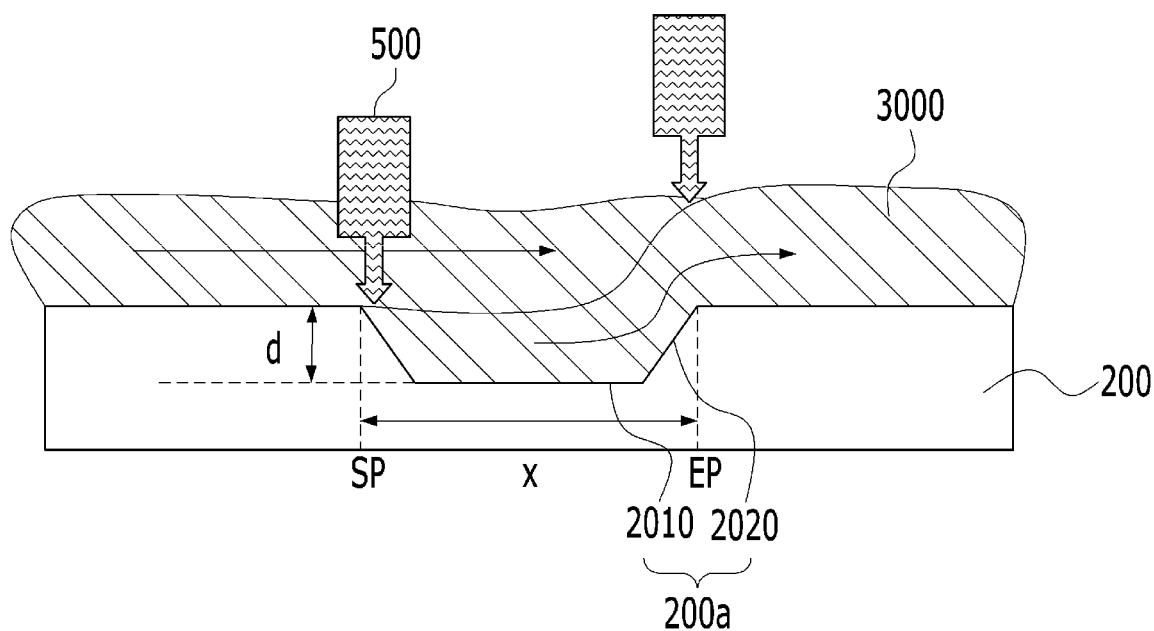
FIG. 4 is a cross-sectional view showing a method of coating a seal pattern on the encapsulation substrate of FIG. 3.

FIG. 3 is a cross-sectional view of an encapsulation substrate of the OLED of FIG. 2 according to an embodiment of the present invention. FIG. 4 is a cross-sectional view showing a method of coating a seal pattern on the encapsulation substrate of FIG. 3.

As shown in FIGS. 3 and 4, the concave part 200a can be formed on a portion of the encapsulation substrate 200. In this instance, the width "x" of the concave part 200a can be an interval between the start point SP and the end point EP for coating a seal pattern material and the first depth "d" can be approximately 0.1 to 0.6 times of the thickness "h" of the of the encapsulation substrate 200. That is, the concave part 200a can be formed by removing a corresponding portion from the inner surface of the encapsulation substrate 200 and the bottom surface 2010 can have the first uniform depth "d".

In addition, a seal pattern material 3000 can be coated while a dispenser 500 is moved in one direction in the path of a loop in which the ending point of the bead of sealing material overlaps with the starting point of the bead, as shown in FIG. 4.

Here, the concave part 200a includes the bottom surface 2010 with the first depth "d" and the lateral surface 2020 surrounding the bottom surface 2010 to have an obtuse angle of approximately 125° to 145° with respect to the bottom surface 2010. This is because the dispenser 500, which is used for coating the seal pattern material 3000, is in a stationary state and, then, performs coating and, in this regard, a predetermined amount of the seal pattern material 3000 may not be discharged at the start point SP and a predetermined time period elapses until a predetermined amount of the seal pattern material 3000 is discharged and, similarly, a predetermined amount of the seal pattern material 3000 may be coated and, then, may be gradually reduced at the end point EP. Accordingly, a coated amount of the seal pattern material 3000 is changed compared with a middle section of the bead, in which a constant amount of the seal pattern material 3000 is discharged and, thus, the lateral surface 2020 can be inclined depending on the gradually changed amount of the coated seal pattern material 3000.

During a procedure of coating the seal pattern material 3000, the width "x" of the concave part 200a can be an interval between the start point SP and the end point EP for coating a seal pattern material and the first depth "d" can be approximately 0.1 to 0.6 times of the thickness "h" of the active area AA of the encapsulation substrate 200. That is, the concave part 200a may be formed by removing a corresponding portion from the inner surface of the encapsulation substrate 200 and the bottom surface 2010 may have the first uniform depth "d". The first depth "d" can be approximately 0.1 times or more of the thickness of the active area AA of the encapsulation substrate 200 to accommodate an excessive amount of the seal pattern material 3000 not to overflow and may be 0.6 times or less of the thickness of the active area AA of the encapsulation substrate 200 to prevent the encapsulation substrate 200 from cracking and being damaged, which occurs in the concave part 200a.

The concave part 200a may be formed in a portion in which coating of the seal pattern material 3000 is duplicated and, as necessary, may be partially formed in a portion in which speed of the dispenser 500 is reduced. This is because, when speed of the dispenser 500 is reduced, a coated amount at the portion with the reduced speed may be increased compared with other regions and, a width of the seal pattern 300 at the portion may be increased and, thus, an excessive amount of the seal pattern material 3000 may be accommodated in the encapsulation substrate 200. For example, as shown in FIG. 4, when the dispenser 500 for discharging the seal pattern material 3000 is moved along four corners of the encapsulation substrate 200, the dispenser 500 needs to change a direction thereof at each corner and, thus, it is necessary to adjust speed of the dispenser 500 and the concave part 200a may be further disposed at each corner. In this instance, the concave part 200a disposed at each corner may have a different shape and a different depth from those of the concave part 200a at the start point SP and the end point EP for coating the seal pattern material 3000.

Accordingly, when a coating procedure of the seal pattern material 3000 of FIG. 4 is completed on the encapsulation substrate 200, the encapsulation substrate 200 and the substrate 100 are adhered to each other and, then, heat curing is completed, the seal pattern 300 heat-cured between the encapsulation substrate 200 and the substrate 100 and the filling seal pattern 300a filled in the concave part 200a of the encapsulation substrate 200 can be formed, as shown in FIG. 4.

The seal pattern 300 and the filling seal pattern 300a can be integrated into each other in the interval "x" between the start point SP and the end point EP for coating the seal pattern material of FIG. 4.

In addition, in FIG. 2, a cross section of the filling seal pattern 300a can be approximately 0.1 to 0.4 times a cross section of the seal pattern 300 connected to the filling seal pattern 300a.

The aforementioned concave part 200a can be disposed to prevent an excessive amount of a seal pattern material from being coated in a specific region during coating of the seal pattern material 3000 and, accordingly, the seal pattern 300 can be formed to a predetermined width in the entire non-active area NA (e.g., the width can remain uniform even for the starting point and ending point of the bead). In addition, the concave part 200a can be disposed to adjust an excessive filled amount of the seal pattern material 3000 and, thus, since it is not necessary to increase the non-active area NA in consideration of a processing margin around a seal pattern, the non-active area NA can be reduced and made even smaller.

Figure 5:
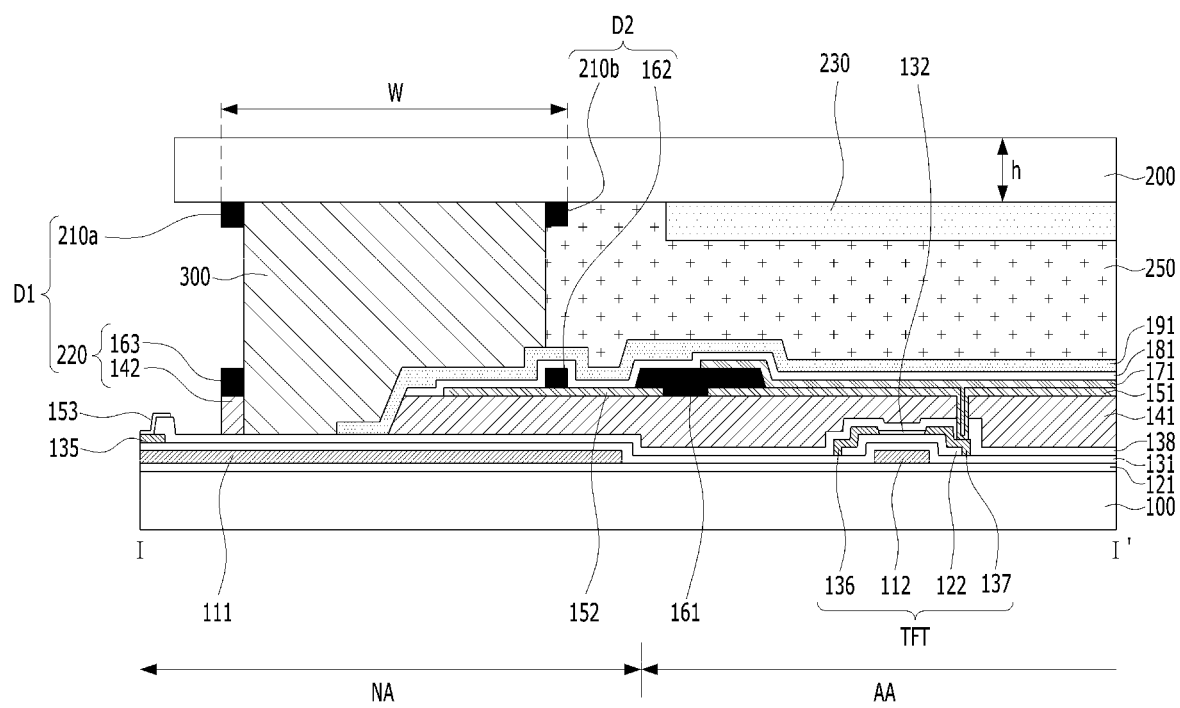
FIG. 5 is a cross-sectional view taken along a line I-I' of FIG. 1.
Figure 6:
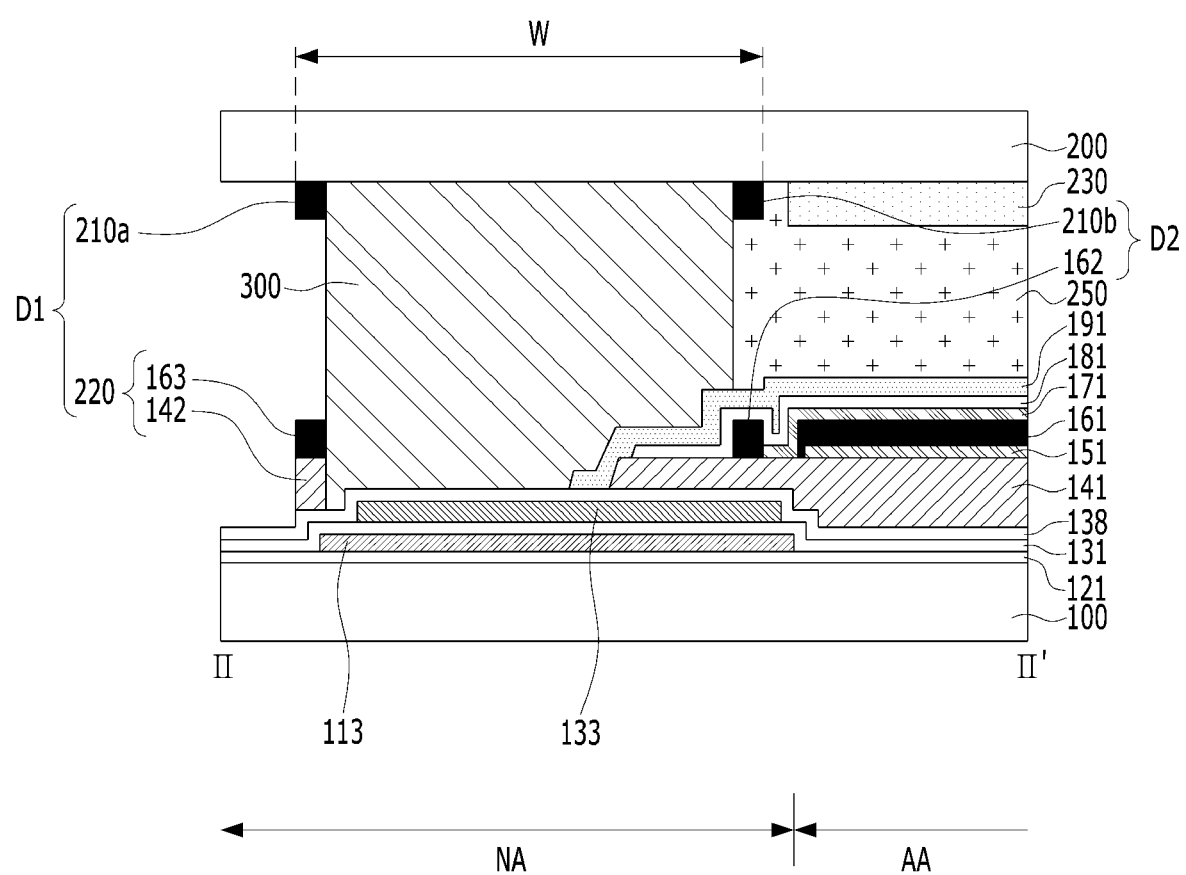
FIG. 6 is a cross-sectional view taken along a line II-IP of FIG. 1.
Figure 7:
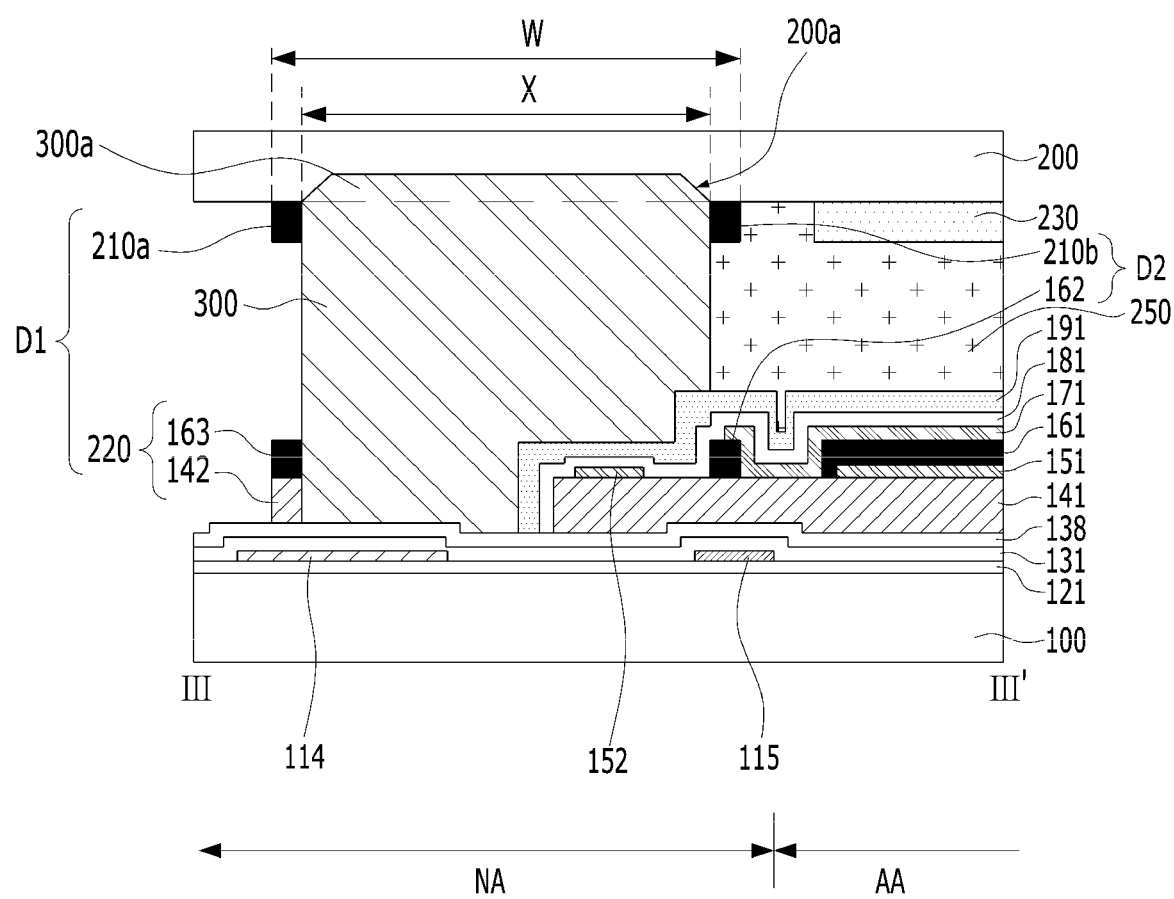
FIG. 7 is a cross-sectional view taken along a line of FIG. 1.

In FIGS. 2 to 4, from the viewpoint of coating the seal pattern material 3000 on the encapsulation substrate 200, the encapsulation substrate 200 is illustrated as a lower part, the inner surface of the encapsulation substrate 200 is illustrated as an upper part, and the substrate 100 including a thin film transistor disposed thereon is positioned at the upper part (e.g., the encapsulation substrate 200 in FIGS. 5-7 is flipped upside down in the view shown in FIGS. 2 to 4). A state after the encapsulation substrate 200 and the substrate 100 are actually adhered or are completely adhered may be an inverse state and, that is, the substrate 100 may be a lower part and the encapsulation substrate 200 may be an upper part or vice versa.

The cross-sectional views of FIGS. 2 to 4 show a non-active area in which the seal pattern 300 is coated and a configuration of an active area is described with reference to the following drawings.

The OLED according to an embodiment of the present invention can control an excessive coated amount during coating of the seal pattern 300 by a configuration of the encapsulation substrate 200 including the aforementioned concave part 200a.

Hereinafter, the OLED including an array configuration according to an embodiment of the present invention is described in detail.

FIG. 5 is a cross-sectional view taken along a line I-I' of FIG. 1. FIG. 6 is a cross-sectional view taken along a line II-IF of FIG. 1. FIG. 7 is a cross-sectional view taken along a line of FIG. 1.

Each sub pixel of the active area AA can include thin film transistor TFT, an overcoat layer 141 for covering the thin film transistor TFT, and an organic light emitting diode (OLED) formed by stacking at least a first electrode 151, an organic light emissive layer 171, and a second electrode 181, which are electrically connected to the thin film transistor TFT on the overcoat layer 141. Although the organic light emissive layer 171 is illustrated as a single layer, this is merely an example and, alternatively, the organic light emissive layer 171 can be formed as a plurality of layers by further including an organic light emitting layer for substantially emitting light, and an hole related layer and an electron related layer, which are disposed below and above the organic light emitting layer. Among the cross-sectional views of FIGS. 5 to 7, only FIG. 5 showing a pad portion and the active area AA adjacent thereto illustrates the thin film transistor TFT but the present invention is not limited thereto and, thus, the thin film transistor TFT can also be disposed in an active area adjacent to a gate pad portion of FIG. 6 and an active area adjacent to a non-pad portion of FIG. 7.

For reference, the thin film transistor TFT can include a gate electrode 112, a semiconductor layer 122, and a source electrode 136 and a drain electrode 137 that are connected to opposite sides of the semiconductor layer 122. A gate insulating layer 131 may be interposed between the gate electrode 112 and the semiconductor layer 122. The illustrated semiconductor layer 122 can be formed of an oxide semiconductor and, thus, an etch stopper 132 can be disposed to protect a channel portion during patterning of the source electrode 136 and the drain electrode 137. However, the thin film transistor is one example and, alternatively, the semiconductor layer 122 can be formed of amorphous silicon or poly silicon or can include a plurality of silicon layer and, in this instance, the etch stopper 132 may be omitted.

The drain electrode 137 can be electrically connected to the first electrode 151 of the organic light emitting diode. The first electrode 151 can be reflective metal and the second electrode 181 can be transparent metal or, reversely, the first electrode 151 can be transparent metal and the second electrode 181 can be reflective metal. The former can refer to a top emission type and the latter can refer to a bottom emission type and, in this regard, the illustrated form corresponds to a structure for maintaining transmittance at the encapsulation substrate 200 and is mainly embodied in a top emission manner.

A pad protective electrode 153 that is formed of the same material at the same layer level as the first electrode 151 can be further disposed on a pad electrode 135 to prevent the pad electrode 135 from being oxidized.

In addition, the seal pattern 300 can include a first dam pattern 220 and a second dam pattern 162, which are disposed at opposite sides of the seal pattern 300, respectively and, thus, a region of the seal pattern 300 can be defined.

A protective layer 191 can be further disposed at an uppermost portion of the substrate 100 to sufficiently cover the second electrode 181 and to protect the organic light emitting diode. The protective layer 191 can be formed of SiON or the like, which is an inorganic insulating layer thicker than the gate insulating layer 131 and an interlayer insulating layer 138 which are approximate insulating layers of the thin film transistor, and may primarily prevent impurities accumulating between the substrate 100 and the encapsulation substrate 200 from penetrating into the organic light emitting diode. A buffer layer 121, the gate insulating layer 131, and the interlayer insulating layer 138 can be an inorganic layer, and the overcoat layer 141, a bank 161, and first to fourth dam patterns 220, 162, 210a, and 210b at an upper portion thereof can be formed of organic materials.

Although the first dam pattern 220 and the second dam pattern 162 that are disposed on the substrate 100 have been described above, the encapsulation substrate 200 can also have a dam function as shown in FIGS. 5 to 7 and, thus, the third dam pattern 210a and the fourth dam pattern 210b that face the first dam pattern 220 and the second dam pattern 162 can be further disposed on one surface of the encapsulation substrate 200 facing the substrate 100.

The bank 161 for defining a light emissive portion of the organic light emitting diode (OLED) can be further included at a boundary portion of the sub pixel Sub-P. Here, the bank 161 can include black resin. The bank 161 can be formed of an organic material and have a thickness of approximately 1 μm to 5 μm, which is similar to the overcoat layer 141 and, more specifically, can have a thickness of approximately 1.1 μm to 3 μm.

Here, the overcoat layer 141 can be formed to entirely cover the active area AA except for a contact hole through which the thin film transistor TFT and the first electrode 151 are connected to each other and can also extend out of an active region to partially overlap with the seal pattern 300. In this instance, a width by which the overcoat layer 141 overlaps with the seal pattern 300 can be different at each of first to fourth sides of the non-active region (a pad portion, opposite gate driver portions integrated formed within the substrate which are electrically connected to gate lines in the active area AA, and a non-pad portion). This is because, since lower configurations of the overcoat layer 141 of the non-active area NA at the respective sides are different, volumes occupying the lower configurations are different and, thus, a volume difference at the respective sides can be compensated for by an overlapping degree of the overcoat layer 141.

As shown in FIG. 5, the pad portion can include the overcoat layer 141 outside a region in which a shorting bare wiring 152 is disposed. The shorting bare wiring 152 can be formed of the same metal material at the same layer level as the first electrode 151. The interlayer insulating layer 138 and the gate insulating layer 131 may be disposed to a thin thickness of about 2000 Å below the overcoat layer 141. This is because, when the shorting bare wiring 152 protrudes out of the overcoat layer 141, a short circuit may occur between a shorting bar wiring and a source link wiring if a pin hole is generated in thin insulating layers. So to prevent such a short circuit between a shorting bare wiring and the source link wiring, the overcoat layer 141 protrudes outside the region having the shorting bare wiring 152.

That is, the thick overcoat layer 141 is positioned below the shorting bar wiring 152 to correspond to a position at which at least a source link wiring 111 is positioned and, thus, even if the interlayer insulating layer 138 and the gate insulating layer 131, which have a thin thickness, are damaged, the distance between shorting bar wiring 152 and the source link wiring 111 can be stably and securely insulated from each other. In addition, to stabilize electric potential of the shorting bare wiring 152, the second electrode 181 can cover an upper portion of the shorting bar wiring 152 and, in this instance, the second electrode 181 can be formed only up to an upper portion of the overcoat layer 141 at a position in which metal such as the source link wiring 111 or a gate metal layer 113, positioned below the second electrode 181, is positioned. This is for a similar function to the aforementioned function of preventing short circuit with a lower metal layer caused by a pin hole of the interlayer insulating layer 138 and the gate insulating layer 131, which have a thin thickness.

As shown in FIGS. 5 and 6, in the pad portion and the gate pad portion, a metal layer is positioned below the overcoat layer 141 and the second electrode 181 is positioned up to an upper portion of the overcoat layer 141 and, as shown in FIG. 7, in the non-pad portion in which a metal layer is not positioned below the overcoat layer 141, the second electrode 181 can cover a lateral portion (e.g., around the outer edge/corner of 141) of the overcoat layer 141 and can be positioned up to the upper portion of the interlayer insulating layer 138 adjacent thereto. Even in the situation of FIG. 7, the second electrode 181 may not overlap with a gate ground wiring 114, which is for the same purpose as prevention of a short circuit. Here, as shown in FIG. 7, the second electrode 181 can be formed as an integrated structure in an entire active area and a partial external portion thereof and can partially overlap with the seal pattern 300 and, in the external portion of the active area, the second electrode 181 can be electrically connected to the shorting bare wiring 152. In the non-active area NA, a gate metal layer 115 is used as a link line or a dummy line. The gate metal layer 115 is positioned at the same layer with the gate ground wiring 114 and the gate line.

In FIGS. 5 to 7, buffer layer 121 that is not described among components on the substrate 100 is a buffer layer, which is disposed to prevent impurities at the substrate 100 from penetrating into the components formed on the substrate 100. Alternatively, when a specific process is performed on the substrate 100, the buffer layer can prevent influence of the process.

The first dam pattern 220 can be disposed by stacking a dummy overcoat layer 142 of a lower side and a bank layer 163 of an upper side. In this instance, the dummy overcoat layer 142 can be formed at the same layer level as the overcoat layer 141 to be spaced apart therefrom and the bank layer 163 can be formed at the same layer level as the bank 161 to be spaced apart therefrom. The second dam pattern 162 can be formed at the same layer level as the bank 161 and spaced apart therefrom.

In this instance, the first dam pattern 220 and the second dam pattern 162 can be manufactured in the same process as that of the overcoat layer 141 and the bank 161.

In addition, the third dam pattern 210a and the fourth dam pattern 210b may be spaced apart from each other and can be manufactured in the same process as that of a black matrix layer or a color filter layer 230, included in the encapsulation substrate 200 to be spaced apart therefrom. As such, the dam patterns can be spaced apart from each other and the dam pattern can be spaced apart from an internal overcoat layer; an internal black matrix layer, or a color filter layer 230 to block a path for moisture penetration. The black matrix layer can have a corresponding shape to the bank 161 disposed on the substrate 100 and the color filter layer 230 can be disposed to correspond to an organic light emitting diode of each sub pixel. In this instance, the color filter layer 230 can overlap with opposite sides of the black matrix layer.

Here, in the substrate 100 and the encapsulation substrate 200, a first dam D1 defines an outer line of the seal pattern 300 including the first dam pattern 220 and the third dam pattern 210a, which are disposed at the same planar position, and a second dam D2 defines an inner line of the seal pattern 300 including the second dam pattern 162 and the fourth dam pattern 210b. The first and second dams D1 and D2 are collectively referred to as a dam D and the organic light emitting display device according to an embodiment of the present invention can have the same width "w" of the dam D at the first to fourth sides of the non-active area.

The seal pattern 300 can be formed of a liquid material with initial viscosity and can include a polymer material including an organic material component such as epoxy as adhesive component and an photo initiator or a thermal initiator, as a main component and, in this instance, a plurality of getters with a moisture absorption function can be dispersed in the polymer material. In this instance, each getter can be any one of calcium chloride, silica gel, activated alumina, lithium chloride, and triethylene glycol and can be a solid component in a liquid polymer material with a spherical shape of a diameter of approximately 0.5 μm to 3 μm or cylindrical or polyhedral shape with a maximum length of approximately 0.5 μm to 3 μm, and the getters can be initially dispersed in the liquid material included in the seal pattern 300 and can be simultaneously fixed in the seal pattern 300 when the liquid material is hardened. In addition, the getter can prevent moisture and outdoor air penetrating from a lateral surface into the seal pattern 300 to protect an organic light emitting array positioned in the active area from moisture or outdoor air. The seal pattern 300 can be dispensed on the substrate 100 on which the thin film transistor array and the organic light emitting array are completely configured or in the non-active area of the encapsulation substrate 200 on which the black matrix layer array and the color filter layer array are completely configured to surround an edge portion of the active area AA. The liquid material with viscosity has dispensing uniformity during a process and, thus, has the same width for each area at a dispensing time point but, since the liquid material has liquidity, when there is a surface deviation on the substrate 100, if pressure is applied after the substrate 100 and the encapsulation substrate 200 are adhered to each other, the spread ability of the liquid material may be changed. When the substrate 100 and the encapsulation substrate 200 are adhered to each other and, then, an interval therebetween becomes a predetermined level, the seal pattern 300 is cured via heat or UV to be maintained in a solid state to constantly maintain the interval between the substrate 100 and the encapsulation substrate 200.

Substantially, to drive sub pixels Sub-Ps in the active area AA, the substrate 100 can include a wiring and driving portion in the non-active area of first to fourth sides (a pad portion, opposite gate pad portions, and a non-pad portion), the wiring and driving portion can be arranged at different sides according to arrangement of a source driver or a flexible printed circuit board, for transmitting a signal and, accordingly, the non-active area on the substrate 100 formed along with the thin film transistor array can have different surface densities at the first to fourth sides. The active area AA at the first side of the non-active area including the pad portion P can include the source link wiring 111 that is connected to each of the plurality of pad electrodes 135 (refer to FIG. 5) in the non-active area. In this instance, the number of the source link wirings 111 can be equal to or greater than the number of data lines in the active area and, thus, the source link wirings 111 can have substantially high density at the first side of the non-active area. For reference, a gate line, which is at the same layer level as 112 in FIG. 5) included in the active area AA is positioned in a lateral direction, a data line is positioned in a longitudinal direction, and the gate line and the data line are positioned at a boundary portion of sub pixels Sub-Ps. Here, the source link wiring 111 can be a wiring for applying a signal to the data line and may be arranged between a lower end of the active area AA and the pad portion P. The illustrated source link wiring 111 can be positioned at the same layer level as the gate line and the gate electrode 112 and, in this instance, the source link wiring 111 can be electrically connected to the pad electrode 135 included in the pad portion P. As necessary, the source link wiring 111 can be integrated into the data line (which is positioned at the same layer level as 136 and 137).

The pad portion can further include a pad electrode for transmitting a gate driving voltage signal, a gate ground signal, and a gate clock signal to a gate pad portion as well as the pad electrode connected to the source link wiring 111. In this instance, when the pad signal for transmitting a data related signal is positioned in a central portion of the pad portion, the pad electrode for transmitting the gate related signal may be positioned at opposite external sides of the pad signal for transmitting the data related signal.

A plurality of pad electrodes can be included in the pad portion of the substrate 100, which protrudes compared with the encapsulation substrate 200, and the source link wiring 111 can be positioned between the pad portion P and the active area AA to connect the pad electrodes to the pad portion. The source link wirings 111 can extend in a vertical direction based on FIG. 1 from the pad portion P and can be integrally connected to the data line (which is positioned at the same layer level as the source electrode 136 and the drain electrode 137) positioned in a lower edge portion of the active area AA to overlap with the seal pattern 300.

Gate drivers GP1 and GP2 can have a gate circuit block corresponding to each gate line and, in this instance, the gate circuit block can include a shift register, a level shifter, and a buffer. The shift register, the level shifter, and the buffer can be configured with a combination of a plurality of wirings and a plurality of thin film transistors. FIG. 6 is a cross-sectional view taken along one surface at the second side of the non-active area and illustrates the situation in which the gate metal layer 113 and a data metal layer 133 completely overlap with the seal pattern 300 but illustrates just one cross section through which a wiring passes and, substantially, the gate pad portion can include a plurality of thin film transistors and a plurality of wirings. The gate drivers GP1 and GP2 can be formed by patterning a layer at the same layer level as an electrode of the gate metal layer 113 formed at the same layer level as a gate line of the active area AA, a material of the same layer as the semiconductor layer 132, and the source metal layer 133 formed at the same layer level as the data line.

The aforementioned gate pad portion can be a type of gate in panel (GIP) and can be configured by embedding a driver for driving a gate line in a non-active area at opposite sides of the substrate 100, rather than in the form of a separate chip or a film. That is, the gate pad portion can be formed in such a way that a plurality of thin film transistors and a plurality of wirings overlap with each other and can be simultaneously formed when the thin film transistor TFT formed in the active area AA is formed. That is, the gate pad portion can be configured in such a way that the thin film transistor TFT is formed and, simultaneously, similar thin film transistors including metal layers 113 and 133, which are the same as metal layers included in the thin film transistor TFT, and a semiconductor layer are connected to respective edges of the gate line.

The first dam pattern 220 can further include the dummy overcoat layer 142 as a lower portion, which is formed at the same layer level as the overcoat layer 141. This corresponds to an upper level of the second dam pattern 162 because the second dam pattern 162 is formed on the overcoat layer 141 that extends from the active area AA. As such, when the seal pattern 300 is spread, the seal pattern 300 can be prevented from overflowing over low dam patterns.

The first dam pattern 220 can be spaced apart from the overcoat layer 141 and, thus, even if moisture partially penetrates into the first dam pattern 220 formed of only an organic material, moisture may not be transmitted to the overcoat layer 141 formed as an integrated structure in the active area AA.

The third dam pattern 210a and the fourth dam pattern 210b can be simultaneously formed to correspond to the active area of the encapsulation substrate 200 when a black matrix layer and a color filter layer are formed. As necessary, when different colors of light emissive layers for emitting different color light are employed as the organic light emissive layer 171 of an organic light emitting diodes included in adjacent sub pixels Sub-Ps, a black matrix layer may be omitted from the encapsulation substrate 200. When a color filter layer is included in the encapsulation substrate 200, the organic light emissive layer 171 of each sub pixel Sub-P can be a light emissive layer that emits white light in the same way.

From the viewpoint of a sectional view, a filling material 250 can be disposed in an area of the seal pattern 300 between an uppermost surface of the substrate 100 and an uppermost surface of the encapsulation substrate 200 to maintain an interval between the substrate 100 and the encapsulation substrate 200. The filling material 250 can contact the seal pattern 300 during a filling procedure after the encapsulation substrate 200 and the substrate 100 are adhered to each other. However, the filling material 250 and the seal pattern 300 are formed of different materials and the filling material 250 is filled adjacently to the seal pattern 300 after the seal pattern 300 is temporally hardened or completely hardened and, thus, the filling material 250 and the seal pattern 300 do not interfere with each other.

The aforementioned organic light emitting display device according to an embodiment of the present invention can include the concave part 200a disposed on the encapsulation substrate 200 with seal pattern material coated thereon to control a width of a dam pattern by providing a space to accommodate an excessive amount of a seal pattern material.

In particular, the concave part 200a can be applied to a point in which an error in terms of a coated amount occurs or is likely to occur due to stoppage of a dispensing procedure as well as a region between start and end points for coating the seal pattern material 3000 and, thus, it can easily and securely control the width of the seal pattern material 3000 coated on an entire region of the encapsulation substrate 200 to be uniform.

In addition, the sub pixel includes, on the substrate, at least one thin film transistor (TFT), the overcoat layer 141 for covering the thin film transistor TFT, and an organic light emitting diode OLED electrically connected to the thin film transistor TFT on the overcoat layer 141. The organic light emitting diode OLED is formed by stacking a first electrode 151, an organic light emissive layer 171, and a second electrode 181. The organic light emissive layer 171 includes at least one emitting layer. The organic light emissive layer 171 can also include a common layer to transport a hole or an electron below or above the emitting layer.

In particular, according to a current trend of reducing an outer region, a concave part can be changed for each region and, thus, when an encapsulation substrate is applied, a width of a seal pattern between a substrate and the encapsulation substrate can be entirely reduced, thereby easily achieving a narrow bezel.

The organic light emitting display device and the method of manufacturing the same according to an embodiment of the present invention may have the following effects.

First, a concave part can be disposed to prevent a seal pattern material from being excessively coated in a specific region during coating of the seal pattern material and, accordingly, a seal pattern can be formed with a uniform width in the entire non-active area NA.

Second, the concave part can be disposed to adjust an excessive filled amount of a seal pattern material and, since it is not necessary to increase a non-active area in consideration of a processing margin around a seal pattern, the non-active area can be reduced, thereby achieving a narrow bezel.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device comprising:
   a substrate including a non-active area and an active area having a plurality of sub pixels;
   an encapsulation substrate facing the substrate;
   a concave part in the encapsulation substrate;
   a seal pattern disposed on the encapsulation substrate in a single continuous closed loop of a seal pattern material;
   a first dam pattern and a second dam pattern, respectively disposed at a first end and a second end of the seal pattern on an inner surface of the substrate; and
   a third dam pattern and a fourth dam pattern, respectively disposed at a first end and a second end of the concave part on an inner surface of the encapsulation substrate,
   wherein the concave part comprises a flat bottom surface having a first depth from the inner surface of the encapsulation substrate and a lateral surface inclined at an obtuse angle with respect to the flat bottom surface of the concave part.

2. The organic light emitting display device of claim 1, wherein the seal pattern has a uniform height.

3. The organic light emitting display device of claim 1, further comprising a filling seal pattern of the same material as the seal pattern material and filled in the concave part to overlap with the seal pattern.

4. The organic light emitting display device of claim 3, wherein the filling seal pattern and the seal pattern have a same width, and
wherein the width of the seal pattern is same to a distance between the first end and the second end of the concave part.

5. The organic light emitting display device of claim 3, wherein a vertical cross section area of the filling seal pattern is 0.1 to 0.4 times as large as a cross section area of the seal pattern connected to the filling seal pattern.

6. The organic light emitting display device of claim 1, wherein the obtuse angle of the lateral surface with respect to the flat bottom surface in the concave part is 125° to 145°.

7. The organic light emitting display device of claim 1, wherein the first depth is 0.1 to 0.6 times as thick as a thickness of the encapsulation substrate.

8. The organic light emitting display device of claim 1, wherein a width of the concave part is larger than the first depth of the concave part.

9. The organic light emitting display device of claim 1, further comprising a color filter layer disposed on the encapsulation substrate to correspond to each of the plurality of sub pixels.

10. The organic light emitting display device of claim 1, wherein the plurality of sub pixels include at least one sub pixel comprising, on the substrate, at least one thin film transistor, an overcoat layer for covering the thin film transistor, and an organic light emitting diode electrically connected to the at least one thin film transistor on the overcoat layer, and
wherein the organic light emitting diode includes a first electrode, an organic light emissive layer, and a second electrode stacked on each other.

11. The organic light emitting display device of claim 10, further comprising a protective layer for covering the organic light emitting diode on the substrate,
wherein the protective layer overlaps with the seal pattern by a partial width.

12. The organic light emitting display device of claim 10, further comprising a filling member disposed in an internal region surrounded by the seal pattern and between the substrate and the encapsulation substrate.

13. The organic light emitting display device of claim 1, further comprising:
a portion of a metal layer overlapping with the seal pattern.

14. The organic light emitting display device of claim 1, wherein the concave part is located between two adjacent corners of the encapsulation substrate.

15. A light emitting display device comprising:
an encapsulation substrate;
a concave part in the encapsulation substrate;
a seal pattern disposed on the encapsulation substrate in a closed loop of a seal pattern material, the closed loop having a starting point and an ending point overlapping with each other and the concave part in the encapsulation substrate;
a first dam pattern and a second dam pattern, respectively disposed at a first end and a second end of the seal pattern on an inner surface of the substrate; and
a third dam pattern and a fourth dam pattern, respectively disposed at a first end and a second end of the concave part on an inner surface of the encapsulation substrate,
wherein the concave part includes a flat bottom surface having a first depth from an inner surface of the encapsulation substrate and a lateral surface inclined at an obtuse angle with respect to the flat bottom surface of the encapsulation substrate.

16. The light emitting display device of claim 15, wherein the seal pattern has a uniform height.

17. The light emitting display device of claim 15, further comprising:
a color filter layer overlapping with at least a portion of the encapsulation substrate.

18. The light emitting display device of claim 15, wherein a width of the concave part is larger than a depth of the concave part.

19. The organic light emitting display device of claim 1, wherein a distance between the third dam pattern and the fourth dam pattern is larger than a width of the flat bottom surface of the concave part.

20. The organic light emitting display device of claim 1, wherein the single continuous closed loop has a starting point and an ending point overlapping with each other and the concave part in the encapsulation substrate.

21. The organic light emitting display device of claim 1, wherein the single continuous closed loop has a shape of a rectangular frame, and the concave part is disposed at a part of one side of the rectangular frame, and
wherein the single continuous closed loop has a singly coated seal pattern material where the concave part is not disposed.

22. The organic light emitting display device of claim 21, wherein the single continuous closed loop has a doubly coated seal pattern material where the concave part is disposed.

* * * * *